(12) United States Patent
Nishio et al.

(10) Patent No.: US 11,462,667 B2
(45) Date of Patent: Oct. 4, 2022

(54) ELECTRONIC COMPONENT, METHOD OF MANUFACTURING ELECTRONIC COMPONENT, AND ELECTRONIC DEVICE

(71) Applicant: HAMAMATSU PHOTONICS K.K., Hamamatsu (JP)

(72) Inventors: Fumitaka Nishio, Hamamatsu (JP); Masatsugu Takatsuka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 59 days.

(21) Appl. No.: 17/040,774

(22) PCT Filed: Mar. 27, 2019

(86) PCT No.: PCT/JP2019/013394
§ 371 (c)(1),
(2) Date: Sep. 23, 2020

(87) PCT Pub. No.: WO2019/230172
PCT Pub. Date: Dec. 5, 2019

(65) Prior Publication Data
US 2021/0005801 A1 Jan. 7, 2021

(30) Foreign Application Priority Data
May 31, 2018 (JP) .............................. JP2018-104831

(51) Int. Cl.
*H01L 33/62* (2010.01)
*H01L 33/00* (2010.01)
(Continued)

(52) U.S. Cl.
CPC .......... *H01L 33/62* (2013.01); *H01L 33/0095* (2013.01); *H01L 33/486* (2013.01);
(Continued)

(58) Field of Classification Search
CPC ........ H01L 33/38; H01L 33/62; H01L 33/486
See application file for complete search history.

(56) References Cited

U.S. PATENT DOCUMENTS
2019/0035701 A1* 1/2019 Iwamoto ................. H01L 23/10

FOREIGN PATENT DOCUMENTS
JP    H07-093338 B2    10/1995
JP    2002-289746 A    10/2002
(Continued)

OTHER PUBLICATIONS
International Preliminary Report on Patentability dated Dec. 10, 2020 for PCT/JP2019/013394.

*Primary Examiner* — Marcos D. Pizarro
*Assistant Examiner* — Antonio B Crite
(74) *Attorney, Agent, or Firm* — Faegre Drinker Biddle & Reath LLP

(57) ABSTRACT

An electronic component includes a wiring substrate having a first surface, a second surface opposite to the first surface, a side surface connected to the first surface and the second surface, and a groove portion formed in the side surface and extending from the first surface to the second surface. The electronic component further includes a first electrode disposed on the first surface along the first surface, a second electrode disposed on the second surface along the second surface, a connection conductor disposed over an entire inner surface of the groove portion and electrically connected to the first electrode and the second electrode, an electronic element disposed on the first surface and electrically connected to the first electrode, and a resin portion disposed on the first surface. All edges of the second electrode are spaced apart from the side surface.

13 Claims, 8 Drawing Sheets

(51) Int. Cl.
*H01L 33/48* (2010.01)
*H01L 33/54* (2010.01)
*H01L 33/58* (2010.01)
*H01L 21/56* (2006.01)
*H01L 23/12* (2006.01)
*H01L 23/28* (2006.01)
*H01L 33/20* (2010.01)
*H01L 33/38* (2010.01)
*H01L 33/56* (2010.01)

(52) U.S. Cl.
CPC .............. *H01L 33/54* (2013.01); *H01L 33/58* (2013.01); *H01L 2933/005* (2013.01); *H01L 2933/0066* (2013.01)

(56) References Cited

FOREIGN PATENT DOCUMENTS

| | | | |
|---|---|---|---|
| JP | 2002-299517 | A | 10/2002 |
| JP | 2003-204081 | A | 7/2003 |
| JP | 2003204081 | A * | 7/2003 |
| JP | 2010-040826 | A | 2/2010 |
| JP | 2010-165991 | A | 7/2010 |
| JP | 2013-102114 | A | 5/2013 |
| JP | 2016-034092 | A | 3/2016 |
| JP | 2016034092 | A * | 3/2016 |

* cited by examiner

ELECTRONIC COMPONENT, METHOD OF MANUFACTURING ELECTRONIC COMPONENT, AND ELECTRONIC DEVICE

TECHNICAL FIELD

One aspect of the present disclosure relates to an electronic component, a method of manufacturing an electronic component, and an electronic device.

BACKGROUND ART

Conventionally, there is known a method of manufacturing an electronic component including the steps of: forming an electrode on a wiring substrate having a through-hole so as to extend from one surface to the other surface via the through-hole; arranging an electronic element on the one surface; arranging a resin portion on a part of the one surface; and obtaining the electronic component by cutting the wiring substrate along a cut line passing through the through-hole (for example, see Patent Literature 1). In such a method of manufacturing an electronic component, electrodes are formed on one surface and the other surface so as to straddle the cut line, and the electrodes on the one surface and the other surface are cut simultaneously with cutting of the wiring substrate.

CITATION LIST

Patent Literature

Patent Literature 1: Japanese Examined Patent Publication No. H07-93338

SUMMARY OF THE INVENTION

Summary of Invention

Technical Problem

In the method of manufacturing an electronic component as described above, since the resin portion is disposed on a part of the one surface, it is necessary to cut the wiring substrate from the one surface side. At this time, burrs protruding toward the opposite side to the one surface may be formed on the cut surface of the electrode on the other surface. If such burrs are formed, there is a possibility that positional deviation occurs when the electronic component is mounted on, for example, a mounting substrate, or the electronic component cannot be stably mounted on the mounting substrate.

Therefore, it is an object of an aspect of the present disclosure to provide an electronic component that can be mounted accurately and stably, a method of manufacturing such an electronic component, and an electronic device including an electronic component mounted accurately and stably.

Solution to Problem

An electronic component according to an aspect of the present disclosure includes a wiring substrate having a first surface, a second surface opposite to the first surface, a side surface connected to the first surface and the second surface, and a groove portion formed in the side surface and extending from the first surface to the second surface; a first electrode disposed on the first surface along the first surface; a second electrode disposed on the second surface along the second surface; a connection conductor disposed on the second surface; and a resin portion disposed on the first surface and covering the electronic element and at least a portion of the first electrode. All edges of the second electrode are spaced apart from the side surface.

In this electronic component, all of the edges of the second electrode disposed on the second surface opposite to the first surface on which the electronic element and the resin portion are disposed are spaced apart from the side surface of the wiring substrate on which the groove portion is formed. In the manufacturing process of the electronic component, the second electrode is not cut when the wiring substrate is cut. Therefore, in this electronic component, no burr is formed on the second electrode, and the surface of the second electrode is flat. Therefore, the electronic component can be mounted accurately and stably. Further, the connection conductor electrically connected to the first electrode and the second electrode is disposed over the entire inner surface of the groove portion. Accordingly, when the second electrode is electrically connected to the mounting electrode of the mounting substrate by, for example, soldering, the solder can uniformly creep up into the groove portion, and reliable electrical connection and firm fixation can be realized. Furthermore, since the connection conductor is cut at the time of cutting the wiring substrate, burrs may be formed on the connection conductor. However, since the burrs can be taken in by the solder uniformly creeping up into the groove portion, it is possible to suppress peeling of the burrs and occurrence of a short circuit or the like due to the peeled burrs. Further, since the all of the edges of the second electrode are spaced apart from the side surface of the wiring substrate, the formation regions of the second electrode and the mounting electrode can be reduced, and as a result, the mounting accuracy of the electronic component can be improved.

All edges of the first electrode may be spaced apart from the side surface. In this case, it is possible to suppress formation of burrs on the first electrode, and as a result, it is possible to suppress occurrence of a short circuit or the like due to the burrs.

The radius of the groove portion may be 0.5 mm or less. Even in such a configuration in which the cross-sectional area of the groove portion is small and patterning of the connection conductor is difficult, highly accurate and stable mounting can be realized.

The resin portion may be made of an epoxy resin. In this case, it is possible to suitably protect components, wirings, and the like mounted on the wiring substrate.

The first surface may have a rectangular shape, and the resin portion may extend from one edge to another edge opposite to the one edge in the first surface. In this case, the handleability of the electronic component can be improved. Further, in the case where the electronic component is mounted such that the side surface on one edge side or the side surface on the other edge side of the wiring substrate is placed on the mounting substrate, the mounting can be facilitated and ensured.

The first electrode may have an extending portion extending along an edge of the resin portion. In this case, in the manufacturing process of the electronic component, the resin portion can be formed while the extending portion is pressed by the mold for forming the resin portion. Accordingly, since the first electrode and the mold are easily closely contacted to each other, leakage of the molten resin can be suppressed. Further, the first electrode can be firmly fixed to the wiring substrate.

The groove portion may be disposed at corners of the first surface and the second surface. Even in such a configuration, highly accurate and stable mounting can be realized.

The groove portion may be spaced apart from the corners of the first and second surfaces. Even in such a configuration, highly accurate and stable mounting can be realized.

The electronic element may be a light-emitting element, and the resin portion may include a lens portion. Even in such a configuration, highly accurate and stable mounting can be realized.

A method of manufacturing an electronic component according to an aspect of the present disclosure includes a first step of preparing a wiring substrate having a first surface, a second surface opposite to the first surface, and a through-hole opened to the first surface and the second surface; a second step of forming a first electrode disposed on the first surface along the first surface, a second electrode disposed on the second surface along the second surface, and a connection conductor disposed over an entire inner surface of the through-hole and electrically connected to the first electrode and the second electrode after the second step; a third step of electrically connecting an element and a first electrode to each other after the second step; a fourth step of forming a resin portion covering at least an electronic element and a connecting portion between the electronic element and the first electrode on the first surface after the third step; and a fifth step of obtaining an electronic component by cutting the wiring substrate from a side of the first face along a cut line passing through the through hole after the fourth step. The second electrode spaced apart from the cut line is formed in the second step.

In this method of manufacturing an electronic component, since the second electrode spaced apart from the cut line for cutting the wiring substrate is formed on the second surface, the second electrode is not cut when the wiring substrate is cut. Therefore, in the obtained electronic component, no burr is formed on the second electrode, and the surface of the second electrode is flat. The electronic component can be mounted accurately and stably. Further, in the obtained electronic component, the connection conductor electrically connected to the first electrode and the second electrode is disposed over the entire inner surface of the groove portion. Accordingly, when the second electrode is electrically connected to the mounting electrode of the mounting substrate by, for example, soldering, the solder can uniformly creep up into the groove portion, and reliable electrical connection and firm fixation can be realized. Furthermore, since the connection conductor is cut at the time of cutting the wiring substrate, burrs may be formed on the connection conductor. However, since the burrs can be taken in by the solder uniformly creeping up into the groove portion, it is possible to suppress peeling of the burrs and occurrence of a short circuit or the like due to the peeled burrs. Further, since the all of the edges of the second electrode are spaced apart from the side surface of the wiring substrate, the formation region of the second electrode and the mounting electrode can be reduced, and as a result, the mounting accuracy of the electronic component can be improved.

In the fourth step, the resin portion may be formed by transfer-molding. In this case, the molten resin can be uniformly poured into the mold for forming the resin portion, and the resin portion can be formed with high accuracy.

In the second step, the first electrode having the extending portion extending along the edge of the region where the resin portion is to be formed may be formed, and in the fourth step, the resin portion may be formed while pressing the extending portion by a mold for forming the resin portion. In this case, since the first electrode and the mold are easily closely contacted to each other, leakage of the molten resin can be suppressed. Further, the first electrode can be firmly fixed to the wiring substrate.

In the fifth step, the wiring substrate may be cut by blade dicing. In this case, the wiring board can be cut at high speed and with high accuracy.

An electronic device according to an aspect of the present disclosure includes: the electronic component described above; and a mounting substrate having a mounting electrode and on which the electronic component is mounted. The second electrode is electrically connected to the mounting electrode by solder. In this electronic device, the electronic component can be mounted accurately and stably for the reasons described above.

Advantageous Effects of Invention

According to an aspect of the present disclosure, it is possible to provide an electronic component that can be mounted accurately and stably, a method of manufacturing such an electronic component, and an electronic device including an electronic component mounted accurately and stably.

DESCRIPTION OF EMBODIMENTS

Figure 1:
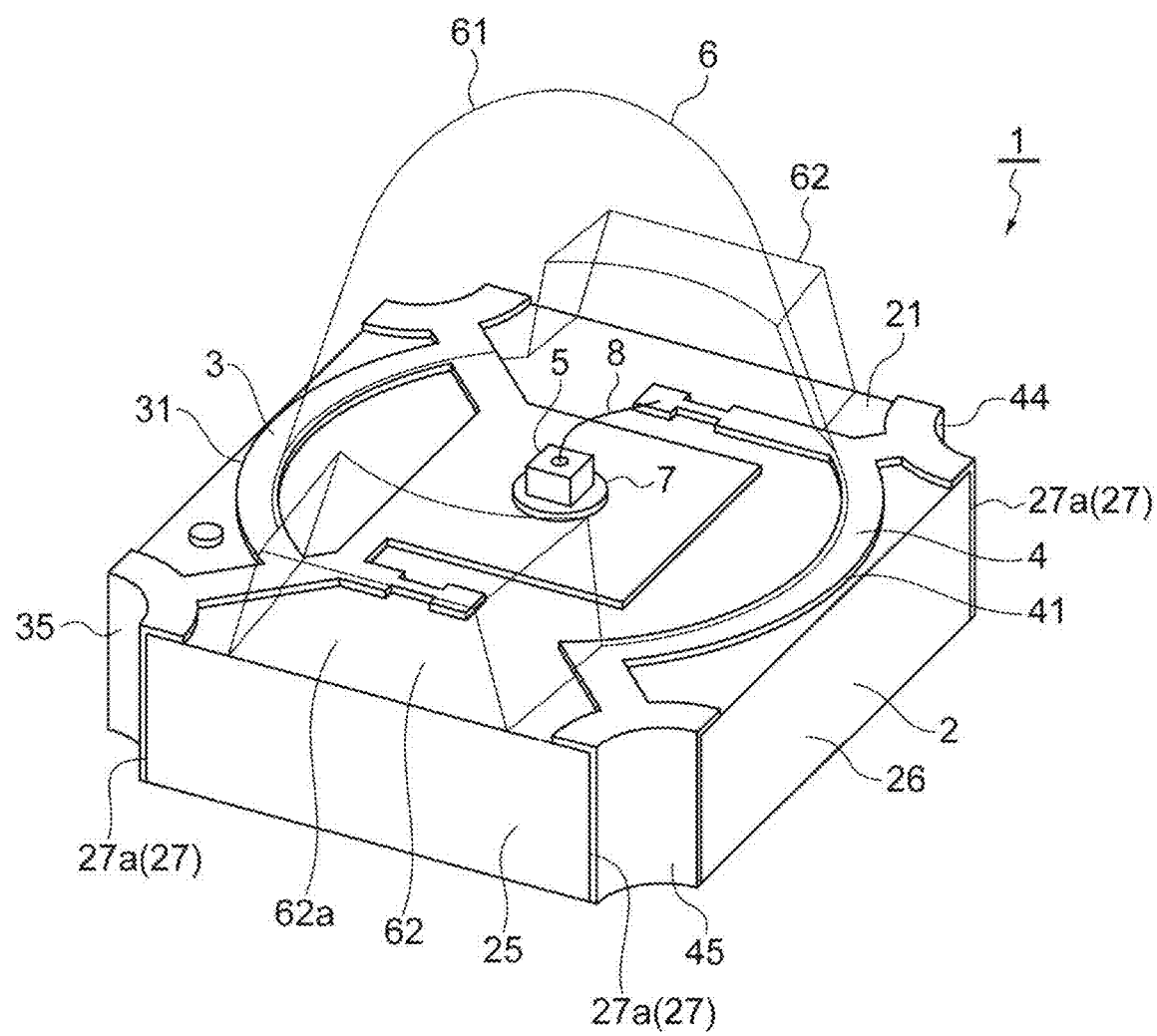
FIG. 1 is a perspective view of an electronic component according to an embodiment.

Hereinafter, an embodiment of the present disclosure will be described in detail with reference to the drawings. In the following description, the same or corresponding elements are denoted by the same reference numerals, and redundant description will be omitted.

[Configuration of Electronic Component]

Figure 2:
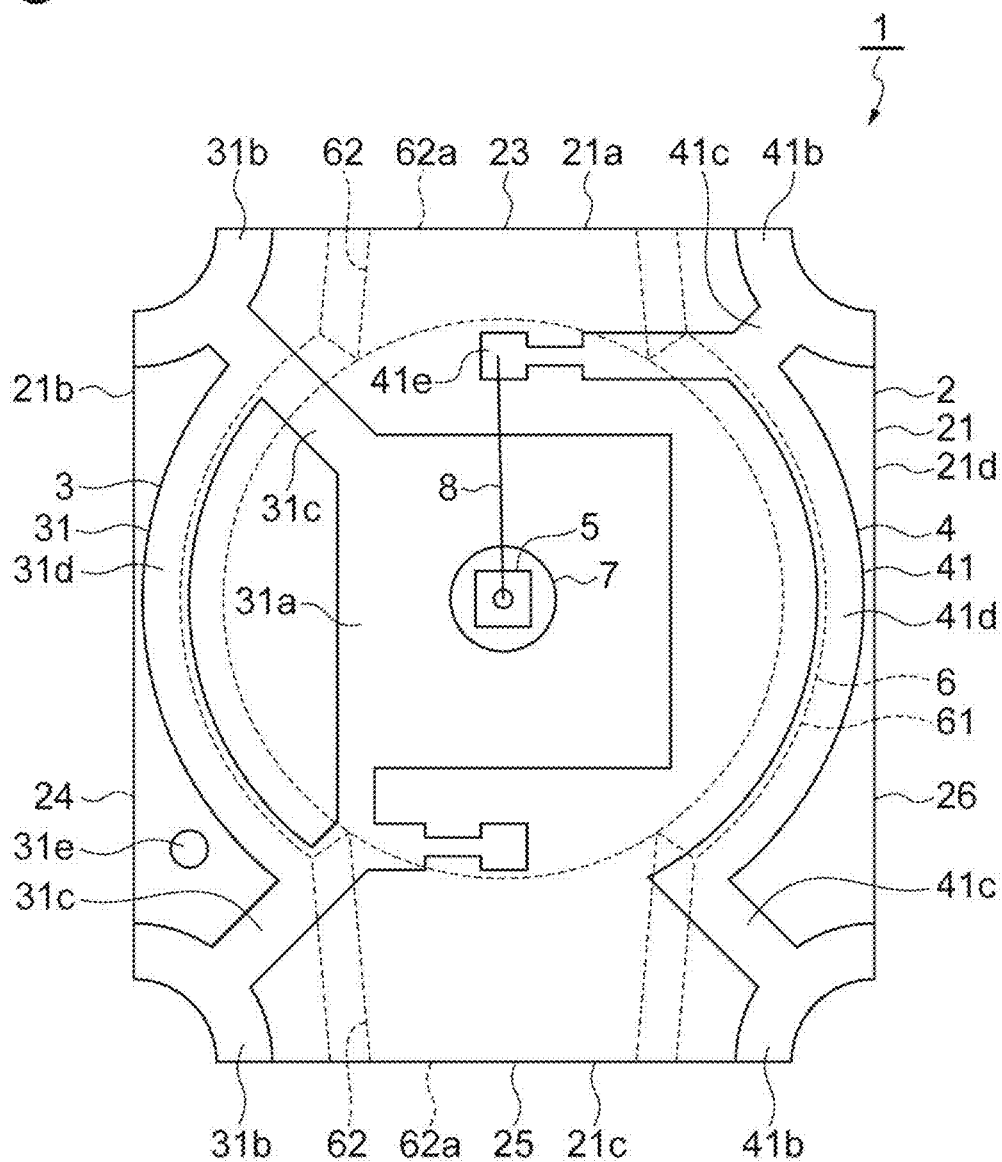
FIG. 2 is a plan view of an electronic component according to an embodiment.
Figure 3:
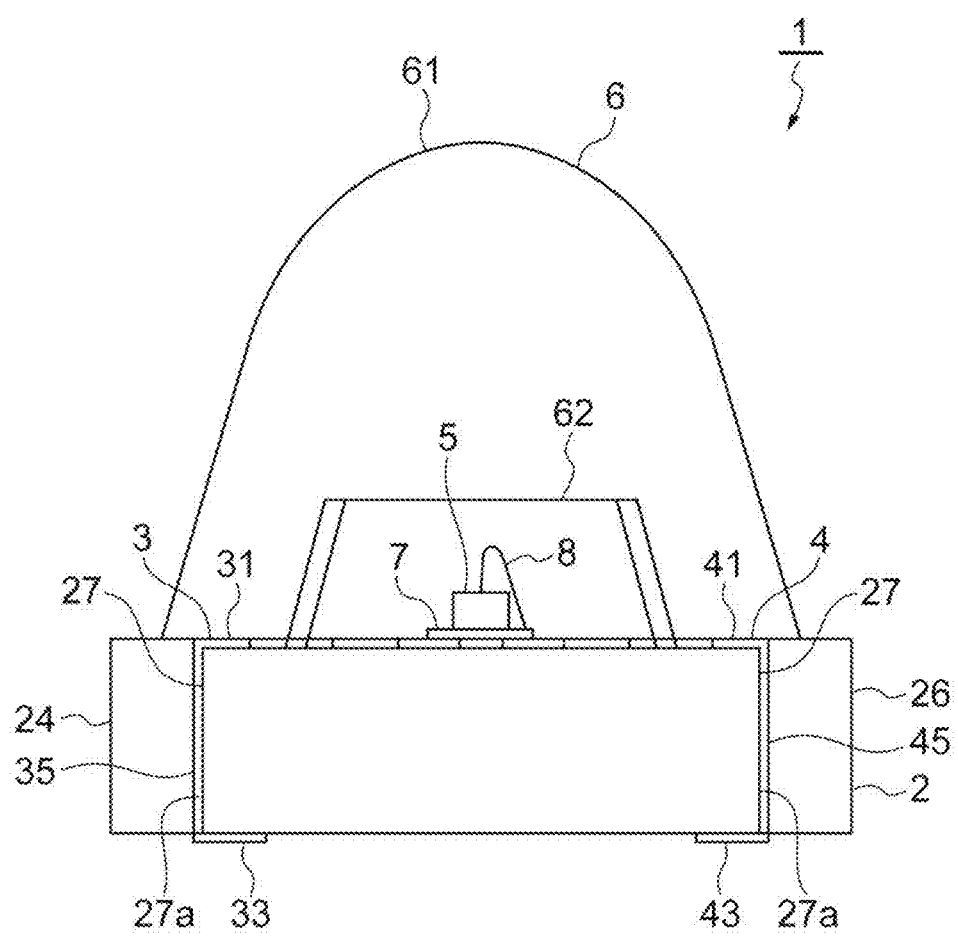
FIG. 3 is a front view of the electronic component according to the embodiment.
Figure 4:
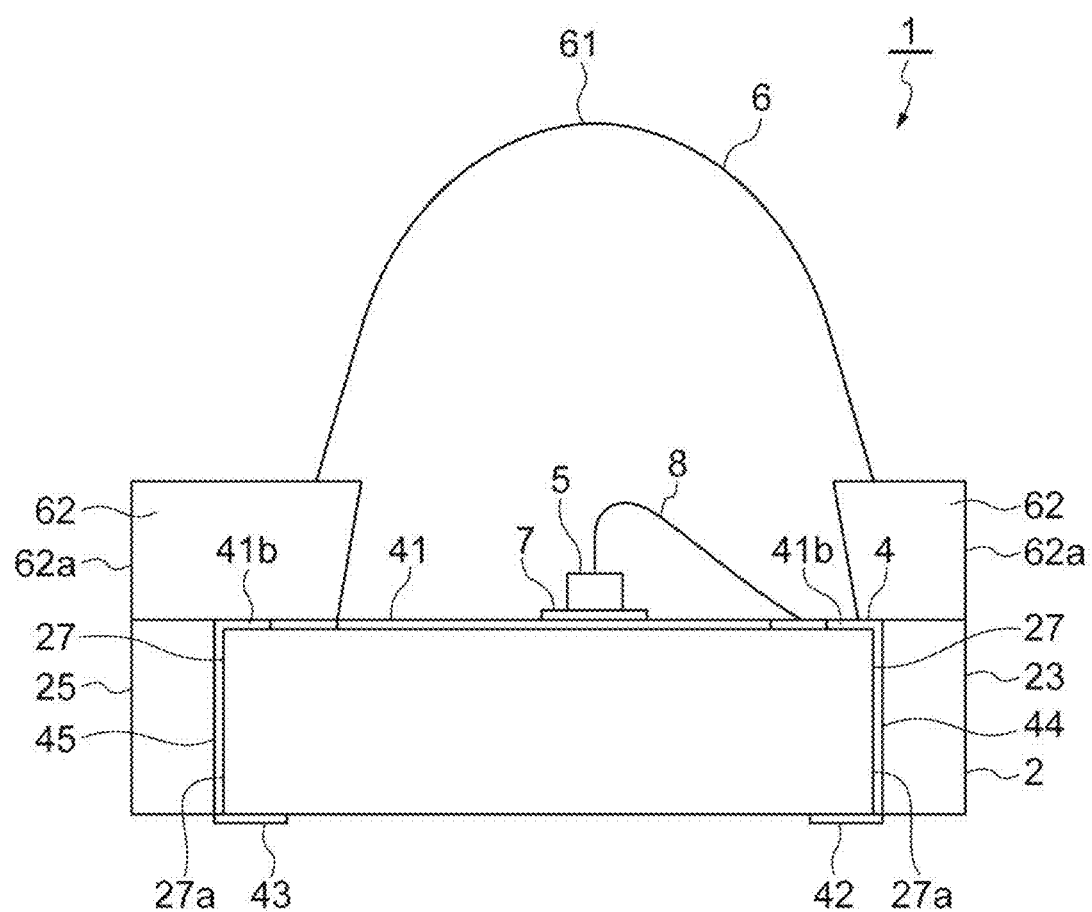
FIG. 4 is a side view of the electronic component according to the embodiment.

The electronic component 1 shown in FIGS. 1 to 5 includes a wiring substrate 2, a pair of electrodes 3, 4, an electronic element 5, and a resin portion 6. The electronic component 1 is, for example, a surface mount electronic device including an optical semiconductor element such as a light emitting diode (LED) as the electronic element 5. The electronic component 1 is mounted on, for example, a mounting substrate (not shown) as a mounting target, and constitutes an electronic device having a chip-on-board structure. In FIG. 2, the resin portion 6 is indicated by a broken line for easy understanding.

The wiring substrate 2 is, for example, a glass epoxy substrate formed in a rectangular plate shape (rectangular parallelepiped shape). The wiring substrate 2 has a first surface 21, a second surface 22 opposite to the first surface 21, four side surfaces 23, 24, 25, 26 connected to the first surface 21 and the second surface 22, respectively, and two groove portions (through holes) 27. The first surface 21, the second surface 22, and each of the side surfaces 23 to 26 have a rectangular shape. The first surface 21 is an element mounting surface on which the electronic element 5 is mounted, and the second surface 22 is a mounting surface to be mounted on a mounting substrate. The first surface 21 has four edges 21a, 21b, 21c, 21d located between the side surfaces 23, 24, 25, 26 respectively. The second surface 22 has four edges 22a, 22b, 22c, 22d located between the side surfaces 23, 24, 25, 26 respectively.

Each of the four groove portions 27 is formed across two adjacent side surfaces among the side surfaces 23 to 26, and extends from the first surface 21 to the second surface 22. That is, the four groove portions 27 are disposed at four corners of the first surface 21 and four corners of the second surface 22, respectively. Each groove portion 27 has a uniform cross-sectional shape along the extending direction. A cross section of each groove portion 27 (a cross section parallel to the first surface 21) has a fan shape having a central angle of 90 degrees (¼ circular shape). The radius of each groove portion 27 in the cross section is 0.5 mm or less.

The electrode 3 includes a first electrode 31 disposed on the first surface 21 along the first surface 21, a pair of second electrodes 32, 33 disposed on the second surface 22 along the second surface, and a pair of connection conductors 34, 35 electrically connected to the first electrode 31 and the second electrode 32 or the first electrode 31 and the second electrode 33. The first electrode 31 includes a central portion 31a, a pair of peripheral portions 31b, a pair of connecting portions 31c, and an extending portion 31d.

The central portion 31a has a rectangular shape and is disposed at a central portion of the first surface 21. The pair of peripheral portions 31b are respectively disposed in the periphery of the two adjacent groove portions 27. Each peripheral portion 31b extends in an arc shape along the edge of the groove portion 27. One peripheral portion 31b extends from the edge 21a of the first surface 21 to the edge 21b adjacent to the edge 21a. The other peripheral portion 31b extends from the edge 21b to the edge 21c adjacent to the edge 21b on the opposite side of the edge 21a in the first surface 21.

The one connection portion 31c is connected to the central portion 31a and the one peripheral portion 31b, and the other connection portion 31c is connected to the central portion 31a and the other peripheral portion 31b. Each connection portion 31c extends linearly. The extending portion 31d is connected to the one connection portion 31c and the other connection portion 31c. The extending portion 31d extends in an arc shape along the edge of the resin portion 6 from the one connecting portion 31c to the other connecting portion 31c. The electrode 3 further includes an index mark portion 31e for preventing the electronic component 1 from being mounted in an incorrect orientation.

The pair of second electrodes 32, 33 are respectively disposed in the periphery of the two adjacent groove portions 27 so as to correspond to the pair of peripheral portions 31b of the first electrode 31. In the present embodiment, the pair of second electrodes 32, 33 and the pair of peripheral portions 31b are disposed so as to partially overlap each other in a plan view (when viewed from a direction perpendicular to the first surface 21).

The second electrode 32 has a substantially rectangular shape (for example, a substantially square shape). A portion of the second electrode 32 on the side of the groove portion 27 has a curved shape along the edge of the groove portion 27. One end 32a of the second electrode 32 faces the edge 22a in parallel with a predetermined distance from the edge 22a of the second surface 22. The other end 32b of the second electrode 32 faces the edge 22b in parallel with a predetermined distance from the edge 22b adjacent to the edge 22a in the second surface 22. In this manner, all of the edges of the second electrode 32 are spaced apart from the side surfaces 23 to 26. In other words, the second electrode 32 is spaced apart from all of the edges 22a to 22d of the second surface 22 except the edge facing the groove portion 27 (is offset from the edges 22a to 22d). Note that "the edge of the second electrode 32 is spaced apart from the side surfaces 23 to 26" does not include a case where the edge of the second electrode 32 reaches any of the edges 22a to 22d (a case where the edge of the second electrode 32 overlaps any of the edges 22a to 22d in plan view). The same applies to the second electrodes 33, 42, 43 described later.

Figure 5:
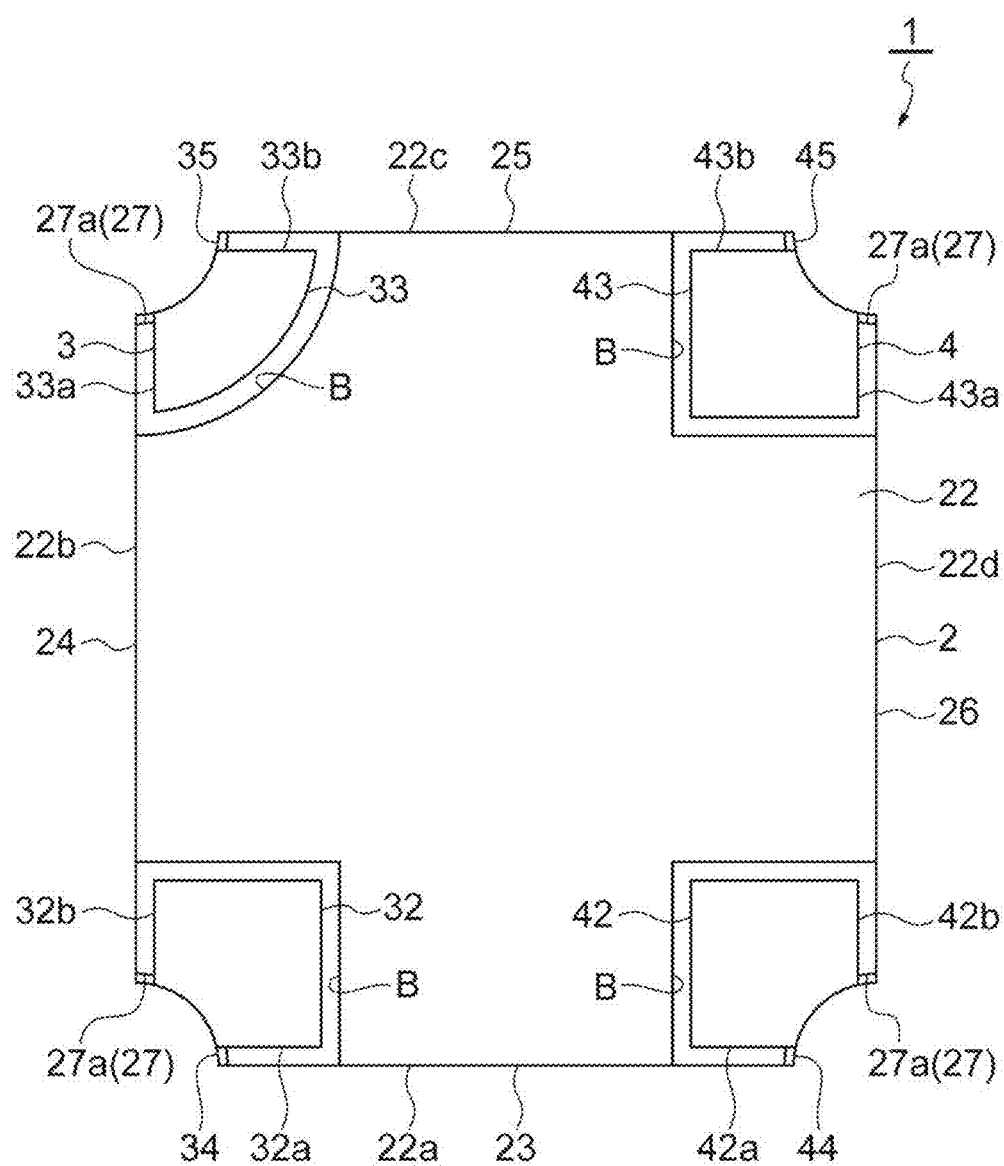
FIG. 5 is a bottom view of the electronic component according to the embodiment.

The second electrode 33 has a curved shape along the edge of the groove portion 27. One end 33a of the second electrode 33 faces the edge 22b in parallel with a predetermined distance from the edge 22b of the second surface 22. The other end 33b of the second electrode 33 faces the edge 22c in parallel with a predetermined distance from the edge 22b from the edge 22c adjacent to the edge 22b on the side opposite to the edge 22a in the second surface 22. In this manner, all of the edges of the second electrode 33 are spaced apart from the side surfaces 23 to 26. Since the second electrode 33 and the second electrode 33 have different shapes, it is possible to suppress erroneous mounting of the electronic component 1 in the direction in which the second electrode 33 and the second electrode 33 face each other. A resist layer is provided on each of the first surface 21 and the second surface 22. In FIG. 5, the edge of the resist layer is indicated by reference B.

The pair of connection conductors 34, 35 are respectively disposed on the inner surfaces 27a of the two adjacent groove portions 27 so as to correspond to the pair of peripheral portions 31b of the first electrode 31 and the pair of second electrodes 32, 33. The inner surface 27a is, for example, curved in an arc shape in plan view, and is connected to two adjacent side surfaces among the side surfaces 23 to 26. Each connection conductor 34, 35 is disposed over the entire inner surface 27a of the groove portion 27. The connection conductor 34 is electrically connected to one peripheral portion 31b of the first electrode 31 and the second electrode 32. The connection conductor 35 is electrically connected to the other peripheral portion 31b of the first electrode 31 and the second electrode 33.

The electrode 4 includes a first electrode 41 disposed on the first surface 21 along the first surface 21, a pair of second electrodes 42, 43 disposed on the second surface 22 along the second surface, and a pair of connection conductors 44, 45 electrically connected to the first electrode 41 and the second electrode 42 or the first electrode 41 and the second electrode 43. The first electrode 41 includes a pair of peripheral portions 41b, a pair of connecting portions 41c, an extending portion 41d, and a lead portion 41e.

The pair of peripheral portions 41b is disposed in the periphery of the two adjacent groove portions 27 on the opposite side of the pair of peripheral portions 31b of the first electrode 31. Each peripheral portion 41b extends in an arc shape along the edge of the groove portion 27. One peripheral portion 41b extends from the edge 21a to the edge 21d adjacent to the edge 21a on the opposite side of the edge 21b in the first surface 21. The other peripheral portion 41b extends from the edge 21d to the edge 21c in the first surface 21.

The extending portion 41d is disposed symmetrically to the extending portion 31d of the first electrode 31 with respect to a straight line passing through the center of the first surface 21 in plan view. That is, the extending portion 41d extends in an arc shape along the edge of the resin portion 6. The one connection portion 41c is connected to the extending portion 41d and the one peripheral portion 41b, and the other connection portion 41c is connected to the extending portion 41d and the other peripheral portion 41b. Each connection portion 41c extends linearly. The lead portion 41e extends from an end portion of the extension portion 41d on the side of the one connection portion 41c toward the opposite side to the peripheral portion 41b. The first electrode 31 further includes a portion formed substantially symmetrically to the lead portion 41e with respect to a straight line passing through the center of the first surface 21 in plan view.

The pair of second electrodes 42, 43 are respectively disposed in the periphery of the two adjacent groove portions 27 so as to correspond to the pair of peripheral portions 41b of the first electrode 41. In the present embodiment, the pair of second electrodes 42, 43 and the pair of peripheral portions 41b are disposed so as to partially overlap each other in plan view.

The second electrode 42 has a substantially rectangular shape (for example, a substantially square shape). A portion of the second electrode 43 on the side of the groove portion 27 has a curved shape along the edge of the groove portion 27. One end 42a of the second electrode 42 faces the edge 22a in parallel with a predetermined distance from the edge 22a of the second surface 22. The other end 42b of the second electrode 42 faces the edge 22d in parallel with a predetermined distance from the edge 22d adjacent to the edge 22a on the side opposite to the edge 22b in the the second surface 22. In this manner, all of the edges of the second electrode 42 are spaced apart from the side surfaces 23 to 26.

The second electrode 43 has a substantially rectangular shape (for example, a substantially square shape). A portion of the second electrode 43 on the side of the groove portion 27 has a curved shape along the edge of the groove portion 27. One end 43a of the second electrode 43 faces the edge 22d in parallel with a predetermined distance from the edge 22d of the second surface 22. The other end 43b of the second electrode 43 faces the edge 22c in parallel with a predetermined distance from the edge 22c of the second surface 22. In this manner, all of the edges of the second electrode 43 are spaced apart from the side surfaces 23 to 26. Since the second electrode 43 and the second electrode 33 have different shapes, it is possible to suppress erroneous mounting of the electronic component 1 in the direction in which the second electrode 43 and the second electrode 33 face each other.

The pair of connection conductors 44, 45 are respectively disposed on the inner surfaces 27a of the two adjacent groove portions 27 so as to correspond to the pair of peripheral portions 41b of the first electrode 41 and the pair of second electrodes 42, 43. Each connection conductor 44, 45 is disposed over the entire inner surface 27a of the groove portion 27. The connection conductor 44 is electrically connected to one peripheral portion 41b of the first electrode 41 and the second electrode 42. The connection conductor 45 is electrically connected to the other peripheral portion 41b of the first electrode 41 and the second electrode 43.

The electronic element 5 is electrically connected to the central portion 31a of the first electrode 31 of the electrode 3 by an adhesive 7 having conductivity. That is, the electronic element 5 is disposed on the first surface 21 via the first electrode 31 and the adhesive 7. The electronic element 5 is electrically connected to the lead portion 41e of the first electrode 41 of the electrode 4 by a wire 8.

The resin portion 6 is disposed on a portion of the first surface 21 so as to cover the electronic element 5, the connection portion between the electronic element 5 and the first electrode 41, and a portion of each of the first electrodes 31, 41. The resin portion 6 is made of, for example, epoxy resin and has optical transparency. The resin portion 6 includes a lens portion 61 and a pair of support portions 62.

The lens portion 61 is disposed at a central portion of the first surface 21. The lens portion 61 has a surface curved in a convex shape toward the side opposite to the first surface 21, and collects light output from the electronic element 5. The pair of support portions 62 sandwich the lens portion 61 therebetween. The one support portion 62 reaches the edge 21a of the first surface 21, and the other support portion 62 reaches the edge 21c of the first surface 21. That is, the resin portion 6 extends from the edge 21a (one edge) to the edge 21c (an edge opposite to the one edge) in the first surface 21. An end surface 62a of one support portion 62 is positioned on the same plane as the side surface 23, and an end surface 62a of the other support portion 62 is positioned on the same plane as the side surface 25. The resin portion 6 may cover the electronic element 5 and at least a part of the first electrode 41, and the shape and arrangement of the resin portion 6 are not limited to the example of the present embodiment.

[Method for Manufacturing Electronic Component]

Figure 6:
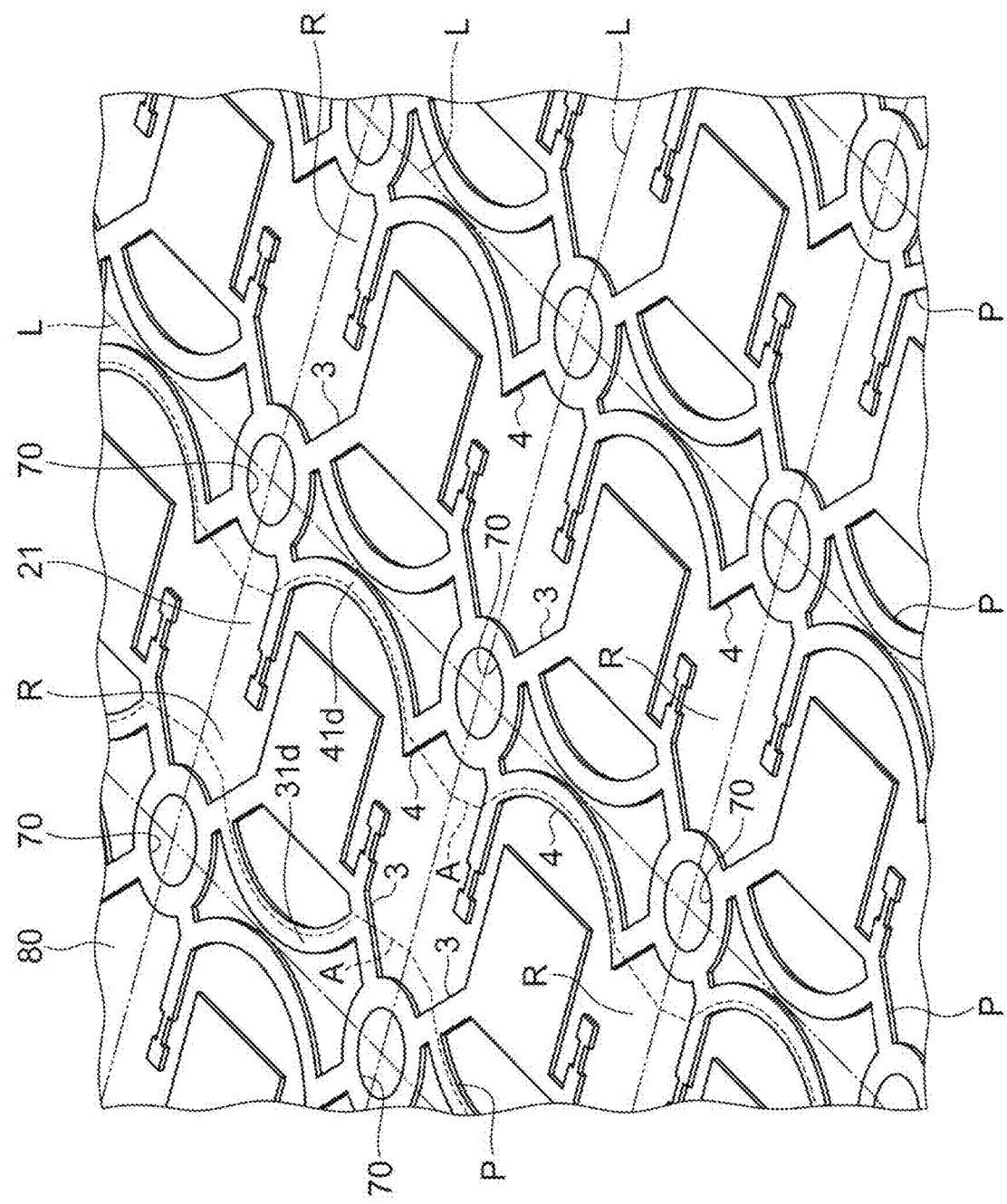
FIG. 6 is a perspective view showing a method for manufacturing an electronic component according to an embodiment.

Next, methods of manufacturing the electronic component 1 will be described with reference to FIGS. 6 to 8. First, the wiring substrate 80 having the first front face 21, the second front face 22, and the plurality of through holes 70 opened to the first front face 21 and the second front face 22 is prepared (FIG. 6, first step). The wiring substrate 80 includes a plurality of portions R corresponding to the wiring substrate 2 described above. For example, the plurality of portions R are arranged in a lattice shape so as to be adjacent to each other. The processing steps described below are performed simultaneously for each portion R. Then, the wiring substrate 80 after completion of the processing is diced along dicing lines (cut lines) L set on the boundaries between the portions R, whereby the wiring substrates 2 are separated from the wiring substrate 80, and the electronic component 1 is obtained.

In the first step, through holes 70 are formed at positions corresponding to the groove portions 27, that is, at intersections of the dicing lines L in each of the portions R. That is, the dicing line L passes through the through hole 70. For example, the through hole 70 penetrates the wiring substrate 80 along a direction perpendicular to the first surface 21 and has a circular cross section.

Subsequently, the first electrodes 31, 41, the second electrodes 32, 33, 42, 43, and the connection conductors 34, 35, 44, 45 are formed on the wiring substrate 80 (FIG. 6, second step). Specifically, a plurality of electrode patterns P corresponding to the electrodes 3, 4 are formed on the wiring substrate 80 by plating and patterning. The plurality of electrode patterns P are arranged along one direction. In each electrode pattern P, the electrode 3 of one portion R and the electrode 4 of the other portion R adjacent to each other in the arrangement direction of the electrode patterns P are integrally formed. The electrode 3 of one portion R and the electrode 3 of the other portion R adjacent to each other in the direction perpendicular to the arrangement direction of the electrode patterns P are integrally formed, and the electrode 4 of one portion R and the electrode 4 of the other portion R adjacent to each other in the direction perpendicular to the arrangement direction of the electrode patterns P are integrally formed.

In the second step, the first electrodes 31, 41 having the extending portions 31d, 41d described above are formed. These extending portions 31d, 41d extend along the edge A of the region where the resin portion 6 is to be formed. Further, in the second step, the second electrodes 32, 33, 42, 43 spaced apart from the dicing line L are formed.

Figure 7:
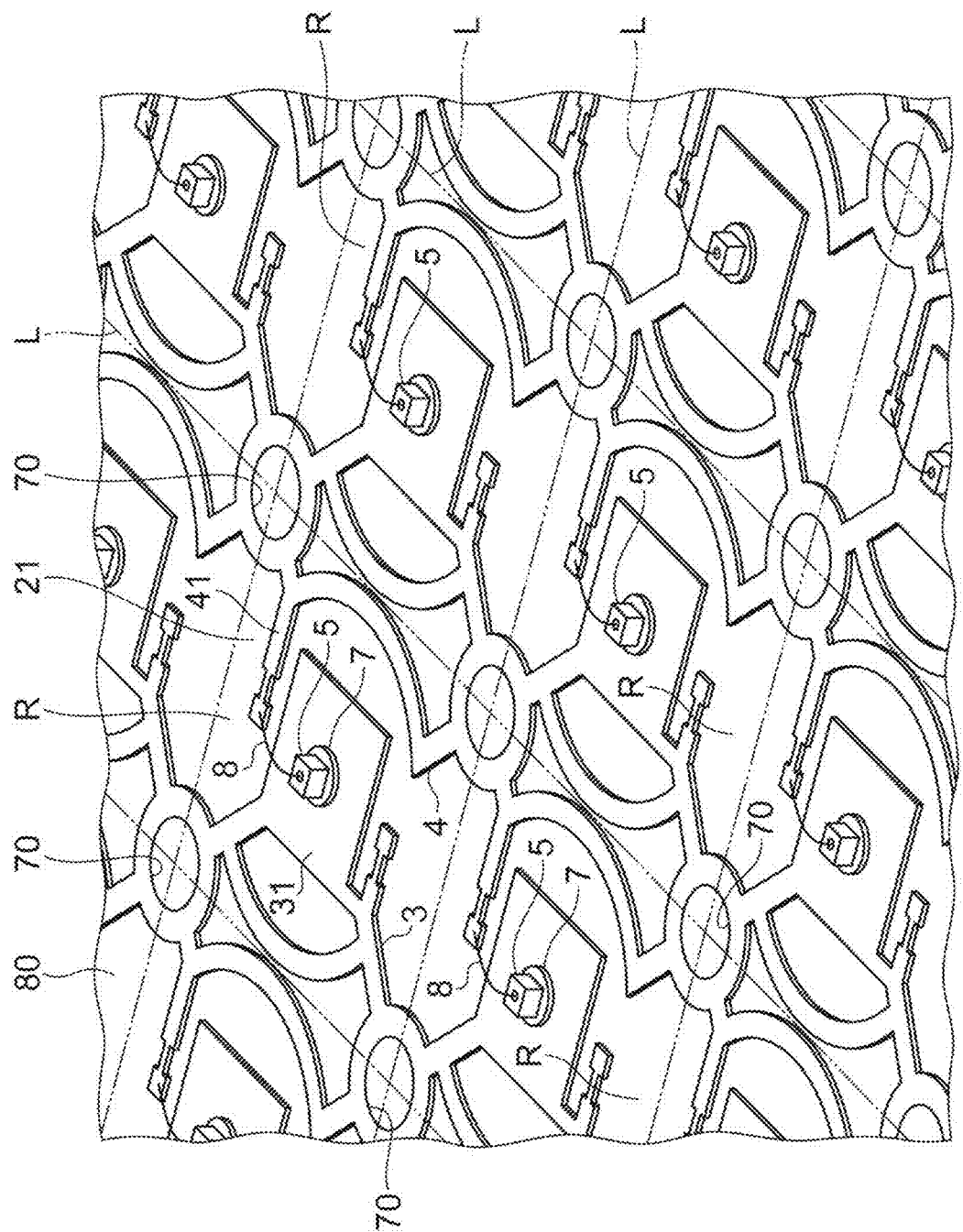
FIG. 7 is a perspective view showing a method for manufacturing an electronic component according to an embodiment.

Subsequently, the electronic element 5 is disposed on the first surfaces 21 of the each of the portions R, and the electronic element 5 and the first electrode 31, 41 are electrically connected to each other (FIG. 7, third step). Specifically, the electronic element 5 is electrically connected to the first electrode 31 of the electrode 3 by the adhesive 7, and the electronic element 5 is electrically connected to the first electrode 41 of the electrode 4 by the wire 8.

Figure 8:
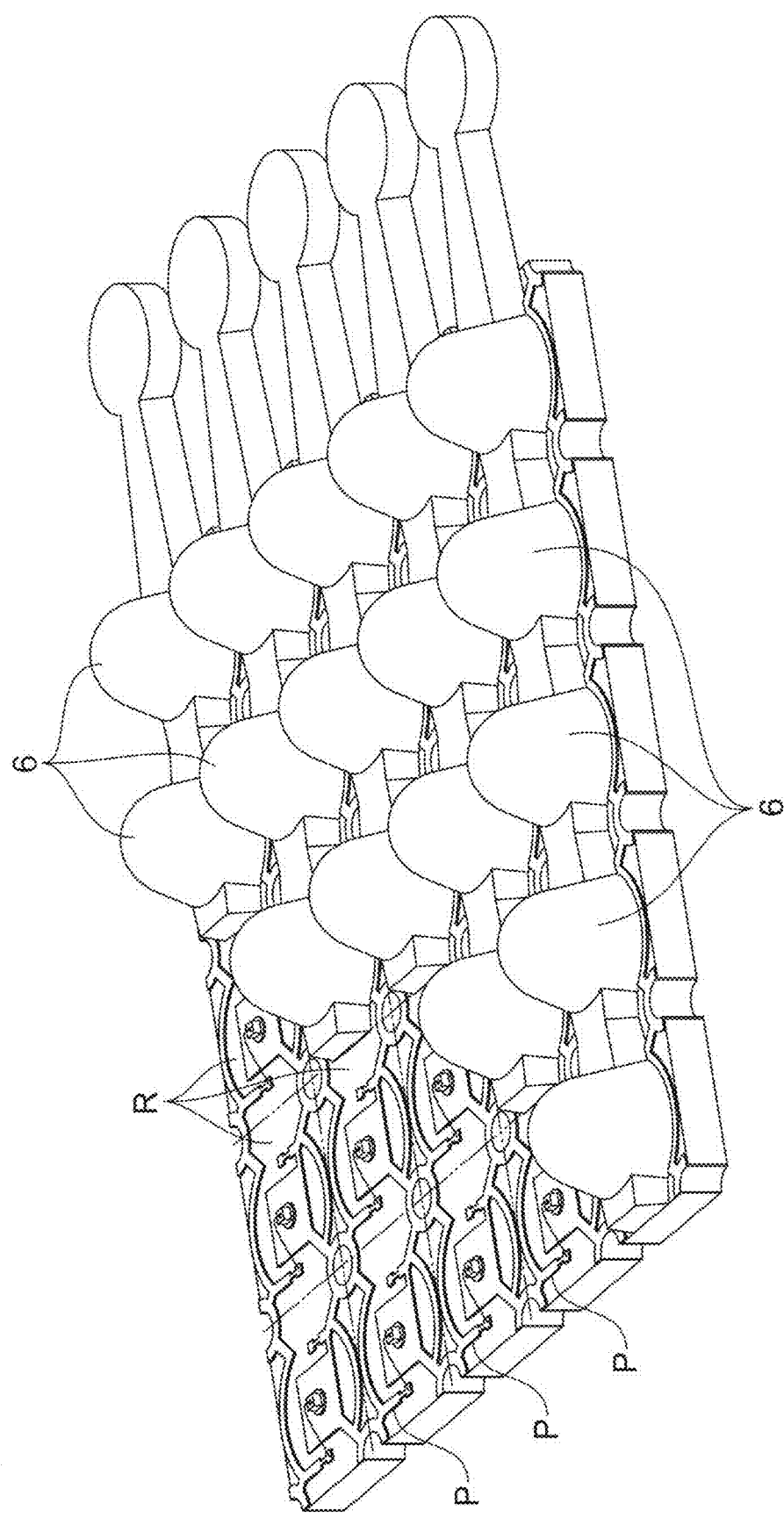
FIG. 8 is a perspective view showing a method for manufacturing an electronic component according to an embodiment.

Subsequently, the resin portions 6 are formed on a part of the first face 21 (FIG. 8, fourth step). In fourth step, the resin portions 6 are formed by transfer-molding, for example. Specifically, the pair of molds are clamped to define a cavity corresponding to the resin portions 6, a molten resin material is poured into the cavity, and the resin material is cured to form the resin portions 6. In the example of FIG. 8, the shape of the cavity (molding die) is set such that the resin portions 6 of the portions R adjacent to each other in the direction perpendicular to the arrangement direction of the electrode patterns P are integrally formed. In fourth step, the resin portions 6 are formed while the extending portions 31d, 41d of the first electrodes 31, 41 are pressed by the mold.

Subsequently, the wiring substrate 80 is cut along the dicing line L from the first surface 21 side to obtain the electronic component 1 (fifth step). In the fifth step, for example, the second surface 22 is attached to a dicing tape to fix the wiring substrate 80, and the wiring substrate 80 is cut by blade dicing. Specifically, for example, while a rotating blade is moved along the dicing line L, the wiring substrate 80 is cut from the side of the first surface 21 by a cutting edge of the blade. When the wiring substrate 80 is cut, the first electrodes 31, 41 and the connection conductors 34, 35, 44, 45 are cut and separated from each other at the boundary of the electrodes 3, 3 and the boundary of the electrodes 3, 4 in each electrode pattern P. In addition, the plurality of resin portions 6 integrally formed in the fourth step are cut and separated at the boundaries therebetween. The electronic component 1 obtained by the above steps can be mounted on a mounting substrate. For example, the second surface 22 is placed on the mounting surface of the mounting substrate, and the second electrodes 32, 33, 42, 43 are electrically connected to the mounting electrode of the mounting substrate by soldering. Accordingly, an electronic device in which the electronic component 1 is mounted on the mounting substrate is obtained.

[Function and Effect]

In the electronic component 1 described above, all of the edges of the second electrodes 32, 33, 42, 43 disposed on the second surface 22 opposite to the first surface 21 on which the electronic element 5 and the resin portion 6 are disposed are spaced apart from the side surfaces 23 to 26 of the wiring substrate 2 on which the groove portion 27 is formed. In the manufacturing process of the electronic component 1, the second electrodes 32, 33, 42, 43 are not cut when the wiring substrate 80 is cut. Therefore, no burr is formed on the second electrodes 32, 33, 42, 43, and the surfaces of the second electrodes 32, 33, 42, 43 are flat. Therefore, the electronic component 1 can be mounted accurately and stably. Further, a connection conductors 34, 35, 44, 45 electrically connected to the first electrodes 31, 41 and the second electrodes 32, 33, 42, 43 are disposed over the entire inner surface 27a of the groove portions 27. As a result, when the second electrodes 32, 33, 42, 43 are electrically connected to the mounting electrodes of the mounting substrate by, for example, soldering, the solder can uniformly creep up into the groove portion 27, and reliable electrical connection and firm fixation can be realized. Furthermore, since the connection conductors 34, 35, 44, 45 are cut when the wiring substrate 80 is cut, there is a possibility that burrs are formed on the connection conductors 34, 35, 44, 45. However, since the burrs can be taken in by the solder uniformly creeping up in the groove portions 27, it is possible to prevent the burrs from being peeled off and a short circuit from being caused by the peeled burrs. Furthermore, since all of the edges of the second electrodes 32, 33, 42, 43 are spaced apart from the side surfaces 23 to 26, it is possible to reduce the formation region of the second electrodes 32, 33, 42, 43 and the mounting electrodes, and as a result, it is possible to improve the mounting accuracy of the electronic component 1. Furthermore, since the resin portion 6 is disposed on a part of the first surface 21, it is possible to suppress the occurrence of warpage in the wiring substrate 2, for example, compared to a case where the resin portion 6 is disposed over the entire first surface 21. Even if burrs are formed at the end portions of the connection conductors 34, 35, 44, 45, since the burrs extend laterally, the burrs hardly affect the mounting of the electronic component 1. The phrase "the connection conductor 34 is disposed over the entire inner surface 27a of the groove portion 27" includes a case where a burr is formed at an end portion of the connection conductor 34 and a very small portion of the connection conductor 34 is peeled off from the inner surface 27a. This also applies to the connection conductors 35, 44, 45.

In the electronic component 1, the radius of the groove portion 27 is 0.5 mm or less. As described above, even in a configuration in which the cross-sectional area of the groove portion 27 is small and patterning of the connection conductors 34, 35, 44, 45 is difficult, highly accurate and stable mounting can be realized.

In the electronic component 1, the resin portion 6 is made of epoxy resin. As a result, it is possible to suitably protect components, wirings, and the like mounted on the wiring substrate 2. That is, it is possible to protect the mounted components including the electronic element 5 and the wire 8, the electrodes 3, 4, and the like. Further, the lens portion 61 can be molded.

In the electronic component 1, the resin portion 6 extends from the edge 21a to the edge 21c in the first surface 21. This improves the handleability of the electronic component 1. Furthermore, when the electronic component 1 is mounted such that the side surface 23 on the side of the edge 21a or the side surface 25 on the side of the edge 22c side in the wiring substrate 2 is placed on the mounting substrate, the mounting can be facilitated and ensured. That is, in the electronic component 1, the electronic component 1 can be mounted on the mounting substrate by placing the second surface 22 on the mounting substrate, or the electronic component 1 can be mounted on the mounting substrate by placing the side surface 23 or the side surface 25 on the mounting substrate. In the latter case, since the support portion 62 of the resin portion 6 functions to support the lens portion 61, the electronic component 1 can be easily and reliably mounted.

In the electronic component 1, the end surfaces 62a of the resin portion 6 are located on the same plane as the side surface 23 or the side surface 25. Accordingly, when the electronic component 1 is mounted such that the side surface 23, 25 of the wiring substrate 2 is placed on the mounting substrate, the mounting can be further facilitated and ensured.

In the electronic component 1, the first electrode 31 includes the extending portion 31d extending along the edge of the resin portion 6. Similarly, the first electrode 41 has an extending portion 41d extending along the edge of the resin portion 6. Accordingly, in the manufacturing process of the electronic component 1, the resin portion 6 can be formed while the extending portions 31d and 41d are pressed by the mold for forming the resin portion 6. Accordingly, since the first electrodes 31, 41 and the mold are easily closely contacted to each other, leakage of the molten resin can be suppressed. Further, the first electrodes 31, 41 can be firmly fixed to the wiring substrate 2. The extending portion 31d may be disposed so as to be positioned between the surface of the wiring substrate 2 and the molding die when molding, and the shape and the disposition of the extending portion 31d are not limited to the example of the present embodiment. In addition to or instead of the extending portion 31d, a metal member separated from the first electrodes 31, 41 and positioned between the surface of the wiring substrate 2 and the mold when molding may be provided on the first surface 21. In this case, the contactness of the mold can be enhanced.

In addition, in the electronic component 1, the groove portions 27 are disposed at the corner portions of the first surface 21 and the second surface 22. Even in such a configuration, highly accurate and stable mounting can be realized. Further, the four grooves 27 are arranged at four corners of the first surface 21 and the second surface 22, respectively. Accordingly, the electronic component 1 can be mounted on the mounting substrate at each of the four corners, and the electronic component 1 can be mounted more stably. Such mounting is particularly effective, for example, when the mounting substrate on which the electronic component 1 is mounted is inserted into another substrate for use. Furthermore, since the four groove portions 27 are respectively disposed at the four corner portions of the first surface 21 and the second surface 22, when the electronic component 1 is mounted such that the side surface 23, 25 of the wiring substrate 2 is placed on the mounting substrate, the electronic component 1 can be mounted more stably. In the electronic component 1, the electronic element 5 is a light emitting element, and the resin portion 6 includes the lens portion 61. Even in such a configuration, highly accurate and stable mounting can be realized.

In the method of manufacturing the electronic component 1 described above, the second electrodes 32, 33, 42, 43 spaced apart from the dicing line L along which the wiring substrate 80 is cut is formed on the second surface 22. Therefore, the second electrodes 32, 33, 42, 43 are not cut when the wiring substrate 80 is cut. Therefore, in the obtained electronic component 1, no burr is formed on the second electrodes 32, 33, 42, 43, and the surfaces of the second electrodes 32, 33, 42, 43 are flat. Such an electronic component 1 can be mounted accurately and stably.

In the method of manufacturing the electronic component 1, the resin portion 6 is formed by transfer molding. Accordingly, the molten resin can be uniformly poured into the mold for forming the resin portion 6, and the resin portion 6 can be formed with high accuracy.

In the method of manufacturing the electronic component 1, the first electrodes 31, 41 having the extending portions 31d, 41d extending along the edge A of the region in which the resin portion 6 is to be formed are formed, and the resin portion 6 is formed while pressing the extending portions 31d, 41d by the mold for forming the resin portion 6. Accordingly, since the first electrodes 31, 41 and the mold are easily closely contacted to each other, leakage of the molten resin can be suppressed. Further, the first electrodes 31, 41 can be firmly fixed to the wiring substrate 80.

In the method of manufacturing the electronic component 1, the wiring substrate 80 is cut by blade dicing. Thus, the wiring substrate 80 can be cut at high speed and with high accuracy.

Although an embodiment of the present disclosure has been described above, the present disclosure is not limited to the above embodiment. The material and shape of each component are not limited to those described above, and various materials and shapes can be adopted. For example, in the above embodiment, all of the edges of the first electrodes 31, 41 may be spaced apart from the side surfaces 23 to 26. In this case, it is possible to suppress formation of burrs on the first electrodes 31, 41, and as a result, it is possible to suppress occurrence of a short circuit or the like due to the burrs. Furthermore, the handleability of the electronic component 1 can be improved. In this case, in the second step described above, the first electrodes 31, 41 spaced apart from the dicing line L are formed. Note that "the edge of the first electrodes 31, 41 are spaced apart from the side surfaces 23 to 26" does not include a case where the edge of the first electrodes 31, 41 reaches any of the edges 21a to 21d (a case where the edge of the first electrodes 31, 41 overlaps any of the edges 21a to 21d in plan view).

In the above embodiment, the groove portions 27 are disposed at the corner portions of the first surface 21 and the second surface 22, but the groove portions 27 may be disposed apart from the corner portions. In other words, the groove portions 27 may be disposed on the side portions of the first surface 21 and the second surface 22. The wiring substrate 2 may have the groove portion 27 disposed at the corner portion and the groove portion 27 disposed apart from the corner portion, or may have only the groove portion 27 disposed apart from the corner portion. The wiring substrate 2 may have only one groove portion 27. In this case, the connection conductor 34 or the connection conductor 35 not disposed in the groove portion 27 may be provided so as to pass through the inside of the wiring substrate 2.

In the above embodiment, the electrode 4 includes the pair of second electrodes 32, 33 and the pair of connection conductors 34, 35. However, the electrode 3 may include only one second electrode and one connection conductor. Similarly, the electrode 4 may include only one second electrode and one connection conductor. The shapes of the first electrodes 31, 41 and the second electrodes 32, 33, 42, 43 are not limited to the examples described above. The cross-sectional shape of the groove portion 27 is not limited to the fan shape. For example, the groove portion 27 may have a semicircular shape when disposed on the side portions of the first surface 21 and the second surface 22.

The electronic element 5 may be another semiconductor element such as a light receiving element. The resin portion 6 does not necessarily function as a lens, and the surface of the resin portion 6 opposite to the first surface 21 may be flat. The resin portion 6 may be disposed on the entire first surface 21. In the above-described embodiment, the resin portion 6 may be formed by compression molding, casting, potting, or attaching a molded product (cap or the like) instead of transfer molding. The wiring substrate 80 may be cut by breaking or laser processing instead of blade dicing.

REFERENCE SIGNS LIST

1: electronic component, 2: wiring substrate, 21: first, 21a to 21d: edge, 22: second, 22a to 22d: edge, 23 to 26: side face, 27: groove, 27a: inner face, 31, 41: first electrode, 31d, 41d: extending portion, 32, 33, 42, 43: second electrode, 34, 35, 44, 45: connecting conductor, 5: electronic element, 6: resin portion, 61: lens portion, 62a: end face, 70: through-hole, 80: wiring substrate, L: dicing line (cut line).

The invention claimed is:

1. An electronic component comprising:
a wiring substrate including a first surface, a second surface opposite to the first surface, a side surface connected to the first surface and the second surface, and a groove portion formed in the side surface and extending from the first surface to the second surface;
a first electrode disposed on the first surface along the first surface;
a second electrode disposed on the second surface along the second surface;
a connection conductor disposed over an entire inner surface of the groove portion and electrically connected to the first electrode and the second electrode;
an electronic element disposed on the first surface and electrically connected to the first electrode; and
a resin portion disposed on the first surface and covering the electronic element and at least a portion of the first electrode;
wherein all edges of the second electrode are spaced apart from the side surface.

2. The electronic component according to claim 1, wherein all edges of the first electrode are spaced apart from the side surface.

3. The electronic component according to claim 1, wherein a radius of the groove portion is 0.5 mm or less.

4. The electronic component according to claim 1, wherein the resin portion is made of an epoxy resin.

5. The electronic component according to claim 1, wherein the first surface has a rectangular shape, and the resin portion extends from one edge to another edge opposite to the one edge in the first surface.

6. The electronic component according to claim 1, wherein the first electrode includes an extending portion extending along an edge of the resin portion.

7. The electronic component according to claim 1, wherein the groove portion is disposed at corner portions of the first surface and the second surface.

8. The electronic component according to claim 1, wherein the groove portion is disposed apart from corner portions of the first surface and the second surface.

9. The electronic component according to claim 1, wherein the electronic element is a light-emitting element, and
the resin portion includes a lens portion.

10. A method of manufacturing an electronic component, comprising:
a first step of preparing a wiring substrate including a first surface, a second surface opposite to the first surface, and a through hole opened to the first surface and the second surface;
a second step of forming, after the first step, a first electrode disposed on the first surface along the first surface, a second electrode disposed on the second surface along the second surface, and a connection conductor disposed over an entire inner surface of the through hole and electrically connected to the first electrode and the second electrode;
a third step of disposing, after the second step, an electronic element on the first surface and electrically connecting the electronic element and the first electrode to each other;
a fourth step of forming, after the third step, a resin portion covering at least the electronic element and a connecting portion between the electronic element and the first electrode on the first surface; and
a fifth step of obtaining, after the fourth step, an electronic component by cutting the wiring substrate from a side of the first surface along a cut line passing through the through hole;
wherein in the second step, the second electrode spaced apart from the cut line is formed.

11. The method of manufacturing an electronic component according to claim 10,
wherein in the fourth step, the resin portion is formed by transfer-molding.

12. The method of manufacturing an electronic component according to claim 10,
wherein in the second step, the first electrode including an extending portion extending along an edge of a region where the resin portion is to be formed is formed, and
in the fourth step, the resin portion is formed while pressing the extending portion by a mold for forming the resin portion.

13. The method of manufacturing an electronic component according to claim 10,
wherein in the fifth step, the wiring substrate is cut by blade dicing.

* * * * *